United States Patent [19]
Paoli et al.

[11] Patent Number: 5,311,536
[45] Date of Patent: May 10, 1994

[54] VERTICALLY STACKED, ACCURATELY POSITIONED DIODE LASERS

[75] Inventors: Thomas L. Paoli, Los Altos, Calif.; James J. Appel, Brighton, N.Y.

[73] Assignee: Xerox Corporation, Stamford, Conn.

[21] Appl. No.: 96,312

[22] Filed: Jul. 23, 1993

Related U.S. Application Data

[63] Continuation-in-part of Ser. No. 948,530, Sep. 22, 1992.

[51] Int. Cl.⁵ .................................................. H01S 3/19
[52] U.S. Cl. ........................................ 372/50; 372/45
[58] Field of Search .................................. 372/50, 45

[56] References Cited

U.S. PATENT DOCUMENTS 4,932,032  6/1990  Koch et al. .............................. 372/45
5,228,050  7/1993  LaCourse et al. ..................... 372/50

OTHER PUBLICATIONS

Wieder, "Polarization Junction Laser", IBM Technical Disclosure Bulletin, vol. 15, No. 1, Jun. 1972, pp. 158-159.

Primary Examiner—Georgia Y. Epps
Attorney, Agent, or Firm—John M. Kelly

[57] ABSTRACT

Nonmonolithic laser arrays having a plurality of lasing elements mounted on protruding members of a stacked support which includes spacers between the protruding members. The protruding members and spacers are comprised of thermally conductive, but electrically insulative material such as BeO. The conductive layers on the spacers and protruding members assist in providing electrical contact to the lasing elements. The stacked support accurately locates and separates the lasing elements and enables low thermal and electrical crosstalk between the lasing elements.

3 Claims, 3 Drawing Sheets

VERTICALLY STACKED, ACCURATELY POSITIONED DIODE LASERS

CROSS-REFERENCE

This application is a continuation-in-part of application Ser. No. 07/948,530, filed Sep. 22, 1992.

The present invention relates to nonmonolithic laser arrays, their fabrication, and their assembly.

BACKGROUND OF THE PRESENT INVENTION

Many laser based devices such as laser printers and optical memories can be improved by incorporating arrays of independently controlled lasing elements. For example, a laser printer using an array of lasing elements can have higher printing speeds and better spot acuity than a printer using only a single lasing element.

Monolithic laser arrays usually output light at one wavelength. Typically, that wavelength is only variable over a small range. However, in many applications, including color printing, it is desirable to output multiple wavelengths that span a wide range; for example, from the infrared through the visible. In color printing this enables one to match laser characteristics to photoreceptor response windows, or to separate overlapping laser beams after scanning by using dichroic filters. When using an array of lasing elements to output multiple wavelengths it is almost always desirable to have low electrical, optical, and thermal crosstalk between the lasing elements.

As compared to present day monolithic laser arrays, nonmonolithic laser arrays can provide a greater range of laser beam characteristics (such as wavelength, polarization and spot sizes) and lower crosstalk. A nonmonolithic laser array usually consists of a plurality of individual laser diodes mounted on a support. In applications such as laser printing, the output laser beams must be accurately spatially separated. Thus, the lasing elements of the nonmonolithic array must be supported such that accurate positioning of the lasing elements is achieved.

Prior art nonmonolithic semiconductor laser arrays usually arrange their lasing elements along a planar support. Alignment of the lasing elements involves external manipulations of the lasing elements on the support. Such laser arrays suffer from several problems. A first is the difficulty of accurately aligning the laser outputs. A second is that achieving closely spaced laser elements is difficult since edge effects limit the minimum spacing between lasing elements, especially in arrays containing more than two elements.

An alternate approach is to vertically stack the lasing elements. Such an arrangement is used in U.S. Pat. No. 4,716,568, issued Dec. 29, 1987, to make an assembly of monolithic bars of diode laser emitters. In that assembly, the laser emitters in each bar are electrically connected in parallel, while the laser bars are electrically connected in series. Thus current simultaneously passes through all of the laser emitters, thereby precluding the separate addressing of the individual emitters.

Thus, there exists a need for methods and devices that enable close, accurate spacing of lasing elements in a nonmonolithic laser array without excessive thermal, optical, and/or electrical crosstalk. Such methods and devices are even more desirable if they permit the accurate orientation of the lasing elements.

SUMMARY OF THE INVENTION

The present invention provides for nonmonolithic laser arrays comprised of lasing elements mounted on protrusions of protruding members of a stacked support. The protruding members are separated by spacers. As the dimensions of the protruding members and spacers, particularly their thickness, can be accurately controlled, so can the relative spatial locations of the lasing elements.

The stacked support provides for current flow to the lasing elements by having conductive layers on the protruding members and spacers, and by conductive wires which connect the conductive layers to the lasing elements as required.

The protruding members and spacers are comprised of a thermally conductive, but electrically insulative, material such as beryllium oxide (BeO) or diamond. To remove heat, the stacked support is beneficially mounted on a thermally conductive heat sink.

The stacked support can be implemented such that plural lasers mount on each protrusion. In such case, a conductive path is provided on each protruding member for each laser source. Each of those conductive paths then connects to a laser source via a conductive wire. A conductive layer on the associated spacer provides a common return.

BRIEF DESCRIPTION OF THE DRAWINGS

Other aspects of the present invention will become apparent as the following description proceeds and upon reference to the drawings, in which.

The following descriptions use directional signals (such as right, left, up, down) which are taken relative to the drawings. Those directional signals are meant to aid the understanding of the present invention, not to limit it.

DESCRIPTION OF THE FIRST ILLUSTRATED EMBODIMENT

Figure 1:
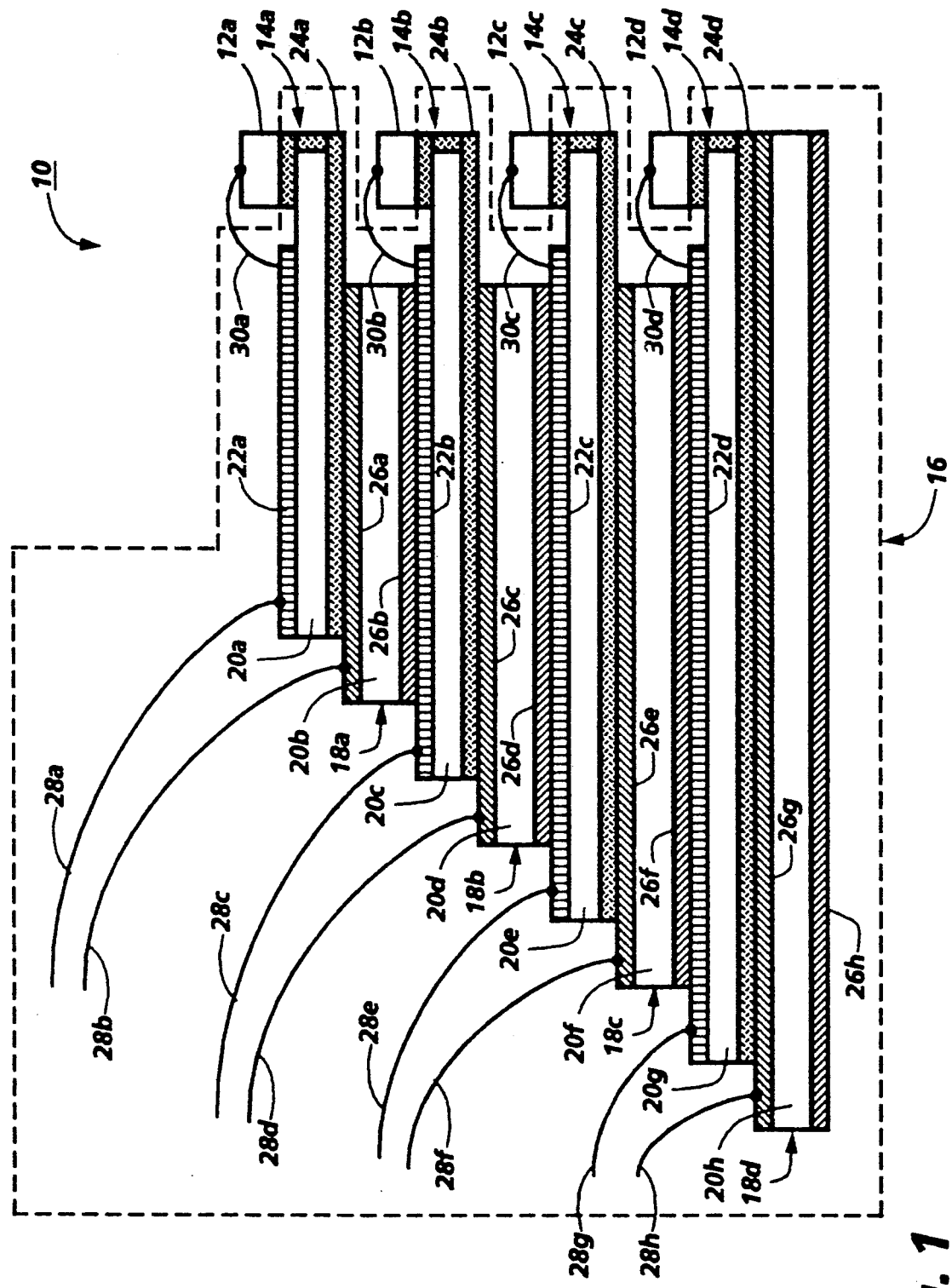
FIG. 1 is an unscaled, side view of a nonmonolithic laser array according to the principles of the present invention.

FIG. 1 shows a first embodiment nonmonolithic laser array 10 according to the principles of the present invention. In the laser array 10, the lasing elements 12a through 12d are mounted on the protrusions of associated protruding members 14a through 14b of a stacked support 16. The stacked support 16 refers to all elements in FIG. 1, except for the lasing elements 12a through 12d.

Beneath each protruding member is an associated spacer, the spacers 18a through 18d. The protruding members and spacers are comprised of heat conductive, electrically insulative bodies, the bodies 20a through 20h, and associated conductive layers (which are described below). The bodies in the laser array 10 are beryllium oxide (BeO). Diamond is another good material.

Heat generated by the lasing elements is conducted by the protrusions into the remainder of the stacked support. From the stacked support, heat can be conducted into an external heatsink (not shown). The thermal conductivity and mass of the stacked support reduce thermal crosstalk between the lasing elements.

Over most, but not all, of the top surface of each protruding member is a top conductive layer, the layers 22a through 22d. Each protruding member also has another conductive layer, the layers 24a through 24d, which extends over the bottom of each protrusion, up over a side (the right side in FIG. 1), and over the protruding part where the lasing elements mount. As shown in FIG. 1, an insulative gap exists between the layers 22a through 22d and their associated layers 24a through 24d. Over the top and bottom surfaces of each spacer are conductive layers, the conductive layers 26a through 26h.

The conductive layers perform several functions. First, they enable assembly of the stacked support 16 by soldering. The conductive layers also enable electrical communication between external current sources and the lasing elements.

Electrical communication is achieved by configuring the stacked support 16 as shown in FIG. 1. As shown, the stacked support is arranged such that the top, left surface of each spacer and of each protruding member is exposed. This permits wires 28a through 28g to be soldered to the conductive layer on each top surface. Furthermore, each protruding member has an exposed portion of its top conductive layer 22 (the layers 22a through 22d) on the right. From those exposed portions wires 30a through 30d connect to the top terminal of the lasing elements.

External current sources (not shown) drive the lasing elements by applying current to associated pairs of the wires 28a through 28h. For example, assume that current is input to the wires 28a and 28b. Current flows into 28a, passes through the conductive layer 22a and the wire 30a to the lasing element 12a. The current then passes through the lasing element (causing it to emit light), through the conductive layer 14a, to the conductive layer 26a, and to the wire 28b. If wires 28b, 28d, 28f, and 28h are grounded, the conductive layers 26a, 26c, 26e, and 26g act as ground planes to reduce electrical crosstalk between the lasing elements.

As the dimensions of the protruding members and spacers can be accurately controlled, so can the relative locations of the bottom surfaces of the lasing elements 12a through 12d. In particular, if the thicknesses of the protruding members and spacers are accurately controlled, the separation between the lasing elements is accurately controlled. Furthermore, if the light is emitted from near the bottom of the lasing elements, or if the location of the light emitting regions is tightly controlled, the relative spatial positions of the output light are accurately controlled.

DESCRIPTION OF THE SECOND ILLUSTRATED EMBODIMENT

Figure 2:
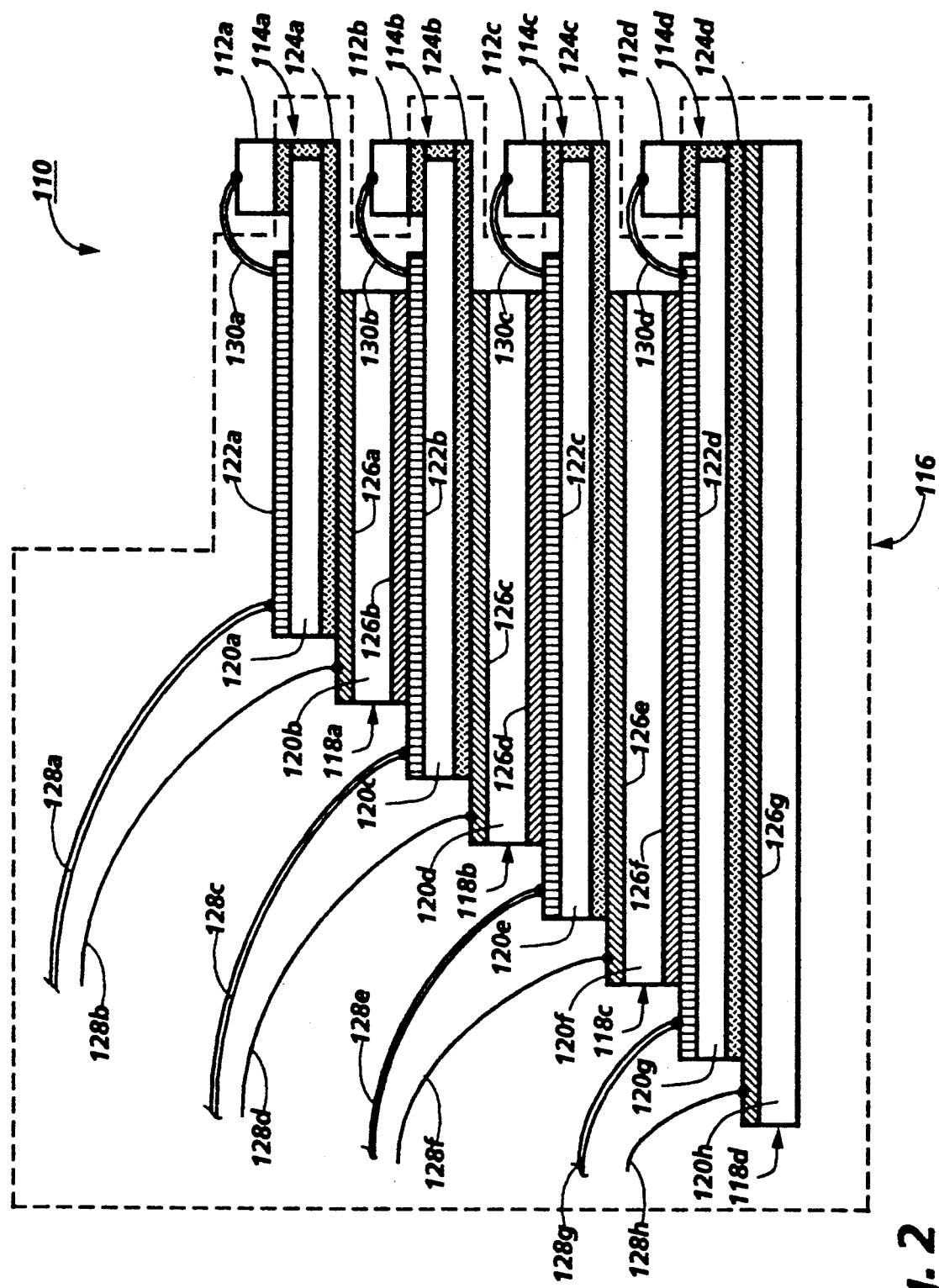
FIG. 2 is an unscaled, side view of a second embodiment laser array according to the principles of the present invention which incorporates a plurality of monolithic laser elements.
Figure 3:
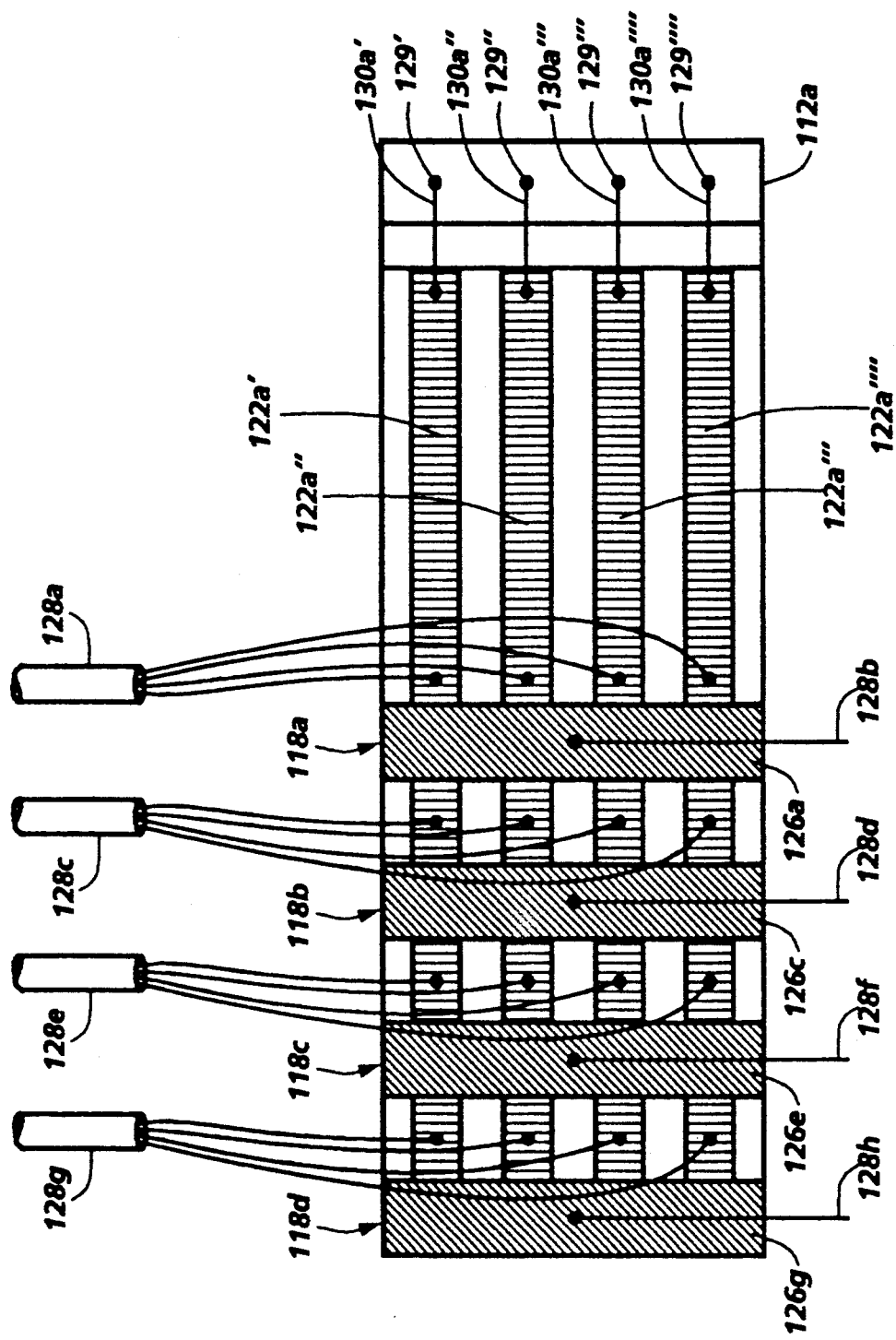
FIG. 3 is an unscaled, top view of the laser array of FIG. 2.

The principles of the present invention are readily extended to structures having more than one lasing element on each protrusion. For example, FIGS. 2 and 3 illustrate a laser array 110 having monolithic laser arrays 112a through 112d of 4 lasing elements each on protrusion 114a through 114d. The elements comprising laser array 110 are numerically designated the same as corresponding elements of the laser array 10, except that a 1 is prefixed to each element.

As shown in FIG. 2, the laser array 110 and its stacked structure 116 are very similar to the laser array 10 and its stacked structure 16. However, in the laser array 110 elements corresponding to the conductive layers 26b, 26d, 26f, 26h of laser array 10 are not used. Making reference now to FIGS. 1, 2 and 3 as required, the individual lasing elements 12a through 12d are replaced by the monolithic arrays 112a through 112d, the protruding members 14a through 14d are replaced by protruding members 114a through 114d, the individual wires 28a, 28c, 28e, and 28g are replaced by wire bundles 128a, 128c, 128e, and 128g of four wires each, and the individual wires 30a through 30d are replaced by wire bundles 130a through 130d of four wires each. Furthermore, the uniform conductive layers 22a through 22d on top of the protruding members 14a through 14d are replaced by patterned conductive paths 122a through 122d on top of the protruding members 114a through 114d.

Referring now to FIG. 1, in the laser array 10 the conductive layers 26b, 26d, 26f, 26h over the bottom of each spacer serve only to assist soldering the stacked support together. If the stacked support is glued together rather then soldered, the layers 26b, 26d, 26f, 26h can be eliminated. As the stacked support 110 is glued together with thermally conductive epoxy, elements corresponding to the layers 26b, 26d, 26f, 26h are not needed. Alternatively, other means may be employed in the presence of layers 26b, 26d, 26f, and 26h to insulate patterned conductive paths 122b, 122c, and 122d from layers 26b, 26d, and 26f, respectively.

FIG. 3 will help clarify the laser array 110. The monolithic laser array 112a mounts on the protruding portion of the protruding member 114a. Over the top of the protruding member 114a are conductive paths 122a' through 122a'''' which are insulated from each other. The monolithic laser array 112a has four lasing elements, each with a terminal 129' through 129''''. Wires 130a' through 130a'''' connect each conductive path 122a' through 122a'''' to an associated terminal 129' through 129'''', respectively. The other end (to the left in FIG. 3) of each conductive path 122a' through 122a'''' connects to individual bonding wires of the cable 128a. The common connection for the monolithic laser array 112a is provided by a wire 128b which connects to the top conductive layer 126a of the support 118a. The top conductive layer 126a connects to the conductive path 124a, which connects to the common terminal of the lasing array 112a.

The remainder of the laser array 110 is formed by stacking protruding members, laser arrays 112, spacers, and wires together as shown in FIGS. 2 and 3. Thus the individual wires of cable 128c connect to individual conductive paths which connect to individual laser elements of array 112b with a common connection provided by conductive layer 126c. The individual wires of cable 128e connect to individual conductive paths which connect to individual laser elements of array 112c with a common connection provided by conductive layer 126e. The individual wires of cable 128g connect to individual conductive paths which connect to individual laser elements of array 112d with a common connection provided by conductive layer 126g.

From the foregoing, numerous modifications and variations of the principles of the present invention will be obvious to those skilled in its art. Therefore the scope of the present invention is to be defined by the appended claims.

What is claimed:

1. A laser array comprising:

a thermally conductive stacked support having at least two protruding members, each with a first and a second conductive layer, and at least one spacer with a third conductive layer disposed between said two protruding members and in contact with said second conductive layer;

at least two lasing elements having two electrical terminals each, each of said lasing elements being mounted on an associated one of said protruding members such that a first of said two electrical terminals is in electrical contact with said second conductive layer of said associated protruding member;

a conductor electrically connecting the second terminal of each said lasing element to said first conductive layer on said associated protruding member; and a second conductor electrically connected to each first conductive layer on said associated protruding member in order to separately address each of said lasing elements.

2. The laser array according to claim 1, wherein at least one of said lasing elements is a monolithic array of individual lasers.

3. The laser array according to claim 2, wherein said first conductive layer comprises at least two separately addressable contacts for electrically connecting to the second terminal of each said lasing element on said associated protruding member.

* * * * *